United States Patent
San et al.

[11] Patent Number: 5,909,397
[45] Date of Patent: Jun. 1, 1999

[54] METHOD AND SYSTEM FOR TESTING AND ADJUSTING THRESHOLD VOLTAGES IN FLASH EEPROMS

[75] Inventors: Kemal T. San, Plano; Cetin Kaya, Dallas; Freidoon Mehrad, Plano, all of Tex.

[73] Assignee: Texas Instruments Incorporated, Dallas, Tex.

[21] Appl. No.: 08/935,240

[22] Filed: Sep. 22, 1997

[51] Int. Cl.⁶ ............................................... G11C 16/04
[52] U.S. Cl. .............................. 365/185.24; 365/185.33
[58] Field of Search .................... 365/185.24, 185.18, 365/185.21, 189.01, 218, 185.03, 185.33

[56] References Cited

U.S. PATENT DOCUMENTS

| | | | |
|---|---|---|---|
| 5,410,511 | 4/1995 | Michiyama | 365/218 |
| 5,412,603 | 5/1995 | Schreck et al. | 365/189.01 |
| 5,424,991 | 6/1995 | Hu | 365/185.24 |
| 5,521,867 | 5/1996 | Chen et al. | 365/185.24 |
| 5,659,550 | 8/1997 | Mehrotra et al. | 371/21.4 |
| 5,729,490 | 3/1998 | Calligaro et al. | 365/185.03 |

*Primary Examiner*—David Nelms
*Assistant Examiner*—David Lam
*Attorney, Agent, or Firm*—Mark A. Valetti; Carlton H. Hoel; Richard L. Donaldson

[57] ABSTRACT

A system for testing and adjusting threshold voltages in flash EEPROMs is disclosed. The system includes a memory cell array (5) comprising a plurality of cell columns. Each cell column includes a plurality of memory cells (10). Each memory cell (10) has a control gate terminal (14), a drain terminal (12) and a source terminal 11. A control system comprising a wordline decoder (16), a column decoder (19) and a microprocessor (21) applies selected voltages to the respective terminals of the memory cells (10), and selects one of the plurality of cell columns for compaction verification. A detector (30) determines whether any one of the memory cells (10) of the selected cell column has a threshold voltage below a predetermined positive voltage, and supplies an output signal to the control system. The control system increases respective threshold voltages of the memory cells (10) of the selected cell column in response to the output signal of the detector (30).

9 Claims, 2 Drawing Sheets

METHOD AND SYSTEM FOR TESTING AND ADJUSTING THRESHOLD VOLTAGES IN FLASH EEPROMS

TECHNICAL FIELD OF THE INVENTION

This invention relates generally to the field of non-volatile memory devices and more particularly to a method and system for testing and adjusting threshold voltages in flash EEPROMS.

BACKGROUND OF THE INVENTION

The use of electrically erasable, programmable read-only memory (EEPROM) devices with floating-gate transistors is well-established. In these devices, each bit is represented by a field-effect transistor (FET) in which a polysilicon floating gate is surrounded by oxide layers which isolate it from both a polysilicon control gate and the substrate. The floating gate may carry a charge to indicate a programmed (logic 1) state, while the absence of a charge indicates an erased (logic 0) state. In the programmed state, the threshold voltage of the FET is higher than in the erased state. This provides a means for detecting the state of a bit or cell.

In some EEPROMs, known as flash EEPROMS, cells may be electrically erased simultaneously in large blocks. One of the problems arising in flash EEPROMs is over-erasure of cells. An over-erased cell has a floating gate with a positive charge, causing the channel under the floating gate to be conductive even with no voltage applied to the control gate. This causes a leakage current which can interfere with the accurate reading of other cells in its column of parallel-connected cells.

One method to prevent over-erasure is to erase the cells with the application of light erasing pulses in steps, checking after each step to determine whether all of the cells have been erased. However, while this method ensures that the threshold voltages of all of the cells will be brought below a certain value, it does not necessarily result in the cells having identical threshold voltages. Instead, because of the variation in the physical characteristics of the cells, a distribution of threshold voltages around a central value results. This distribution may resemble a normal distribution. To achieve uniformity throughout the EEPROM, it is desirable to tighten or compact this distribution, to bring each threshold voltage as close as possible to a central value.

Another problem arising in flash EEPROMs is the limited number of programming-and-erasure cycles to which the cells can be subjected. When a program step is performed for a selected cell after a flash-erase of the array, a high bias voltage on the bitline for the selected cell will cause any other cells with low threshold voltages in the same column as the selected cell to conduct a leakage current. Because of short-channel effects and potential coupling between the bitline and the floating gate, this leakage may occur even if the cells in the same column as the selected cell have positive threshold voltages.

As a result of the leakage current during programming, electrons bombard the high-voltage drain-channel junction, releasing electron-hole pairs underneath the oxide layer that separates the floating gate from the channel. These electron-hole pairs become trapped in the oxide layer, generating interface states or traps and oxide charge. The oxide layer then interacts with the substrate and behaves like a capacitor, shielding the floating gate from the channel. These phenomena cause a gradual degradation in the transconductance of a cell. With reduced transconductance, the cell fails to conduct the expected level of current when turned on, resulting in inaccurate reading of the cell's bit value and, consequently, chip failure.

SUMMARY OF THE INVENTION

Therefore, a need has arisen for a method and system for testing and adjusting threshold voltages in flash EEPROMs that overcomes the disadvantages and deficiencies of the prior art.

A system for testing and adjusting threshold voltages in flash EEPROMs is provided. The system includes a memory cell array comprising a plurality of cell columns. Each cell column includes a plurality of memory cells. Each memory cell has a control gate terminal, a drain terminal and a source terminal. A control system applies selected voltages to the respective terminals of the memory cells, and selects one of the plurality of cell columns for compaction verification. A detector determines whether any one of the memory cells of the selected cell column has a threshold voltage below a predetermined positive voltage, and generates an output signal.

In one embodiment, the control system is operable to receive the output signal of the detector, and to increase respective threshold voltages of the memory cells of the selected cell column in response to the output signal of the detector.

A method for compacting a threshold voltage distribution of a floating-gate EEPROM in accordance with the invention is also provided. The method comprises the steps of selecting a cell column having a plurality of memory cells; applying a positive control gate voltage to a control gate terminal of each one of the memory cells of the selected cell column; detecting a total current conducted by the plurality of memory cells of the selected cell column; comparing the total current to a reference current; and increasing respective threshold voltages of the memory cells of the selected cell column in response to the comparing step.

A technical advantage of the present invention is that the method for compacting a threshold voltage distribution of a floating-gate EEPROM prevents leakage currents from being conducted by adjacent cells when a cell is being programmed. Another technical advantage is that the number of programming cycles to which the cells may be subjected without transconductance degradation is increased. Yet another technical advantage is that testing and adjustment an entire memory cell array may be completed quickly. A further technical advantage is that leakage current from adjacent cells during reading of a cell is reduced or eliminated.

BRIEF DESCRIPTION OF THE DRAWINGS

For a more complete understanding of the present invention, the objects and advantages thereof, reference is now made to the following descriptions taken in connection with the accompanying drawings in which.

DETAILED DESCRIPTION OF THE INVENTION

Figure 1:
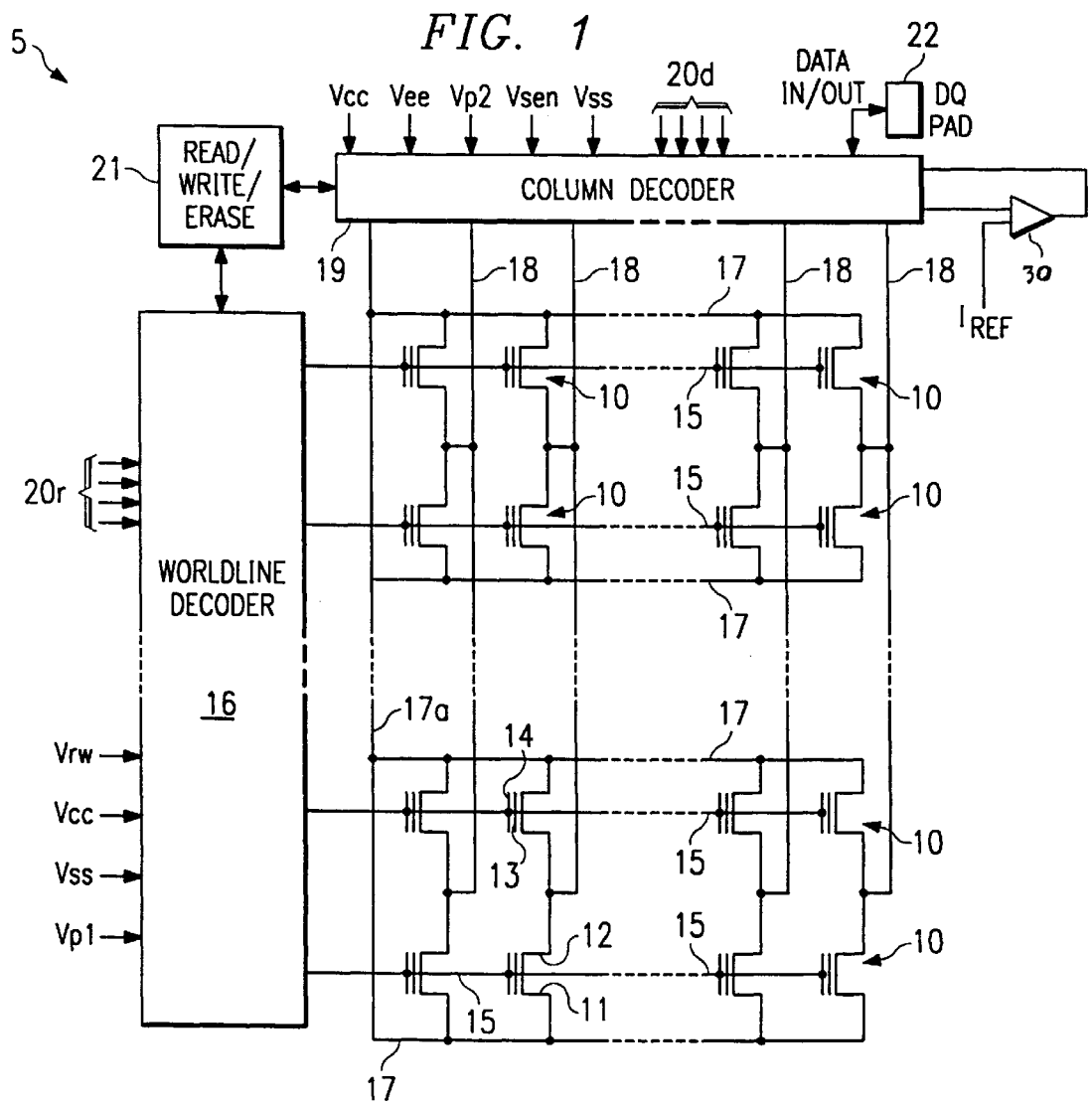
FIG. 1 is a schematic diagram, in partial block form, of a floating-gate memory cell array.

The preferred embodiment of the present invention and its advantages are best understood by referring to FIGS. 1 through 3 of the drawings, like numerals being used for like and corresponding parts of the various drawings.

Referring to FIG. 1, an exemplary array 5 of memory cells in a memory chip is shown. The array 5 is operable to store, read and erase binary data. Each cell in the array 5 is a floating-gate transistor 10 having a source 11, a drain 12, a floating gate 13 and a control gate 14.

The cells 10 are controlled by a control system comprising a wordline decoder 16, a column decoder 19, a microprocessor 21, and a current comparator 30 connected to the column decoder 19. Each of the control gates 14 in a row of cells 10 is connected to a wordline 15, which is in turn connected to the wordline decoder 16. Each of the sources 11 in a row of cells 10 is connected to a source line 17. Each of the drains 12 in a column of cells 10 is connected to a drain-column line 18, also known as a bitline, which is in turn connected to the column decoder 19. Each of the source lines 17 is connected by a common-column line 17a to the column decoder 19. The microprocessor 21 communicates with column decoder 19 and wordline decoder 16. Among other things, microprocessor 21 determines whether data are to be stored, erased, or read from the cells 10.

Figure 2:
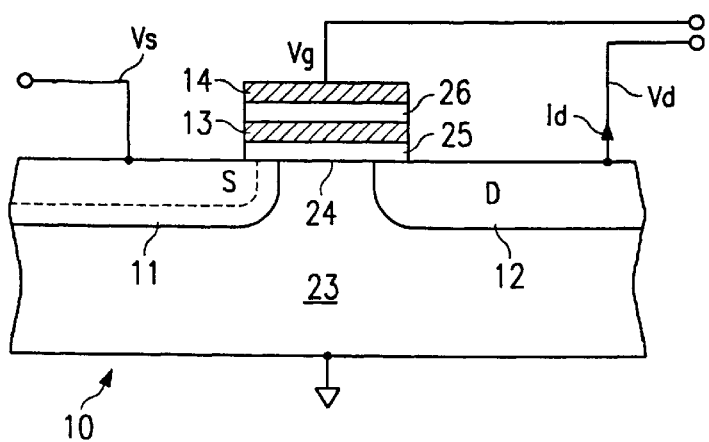
FIG. 2 is a cross section of a typical floating-gate memory cell of the type used in the memory cell array.

Referring to FIG. 2, a cross section of a typical floating-gate cell 10 of the type used in the memory cell array 5 of FIG. 1 is shown. Source 11 and drain 12 are formed by impurity diffusion in a semiconductor substrate 23 having impurity of the opposite type from the source 11 and drain 12 diffusions. The area of the substrate 23 between the source 11 and the drain 12 is the cell channel 24. The floating gate 13 is formed from a layer of polysilicon insulated from the channel 24 by a gate insulator 25. The polysilicon control gate 14, which is connected to a wordline 15 of FIG. 1, is insulated from the floating gate 13 by an interlevel insulator 26.

Figure 3:
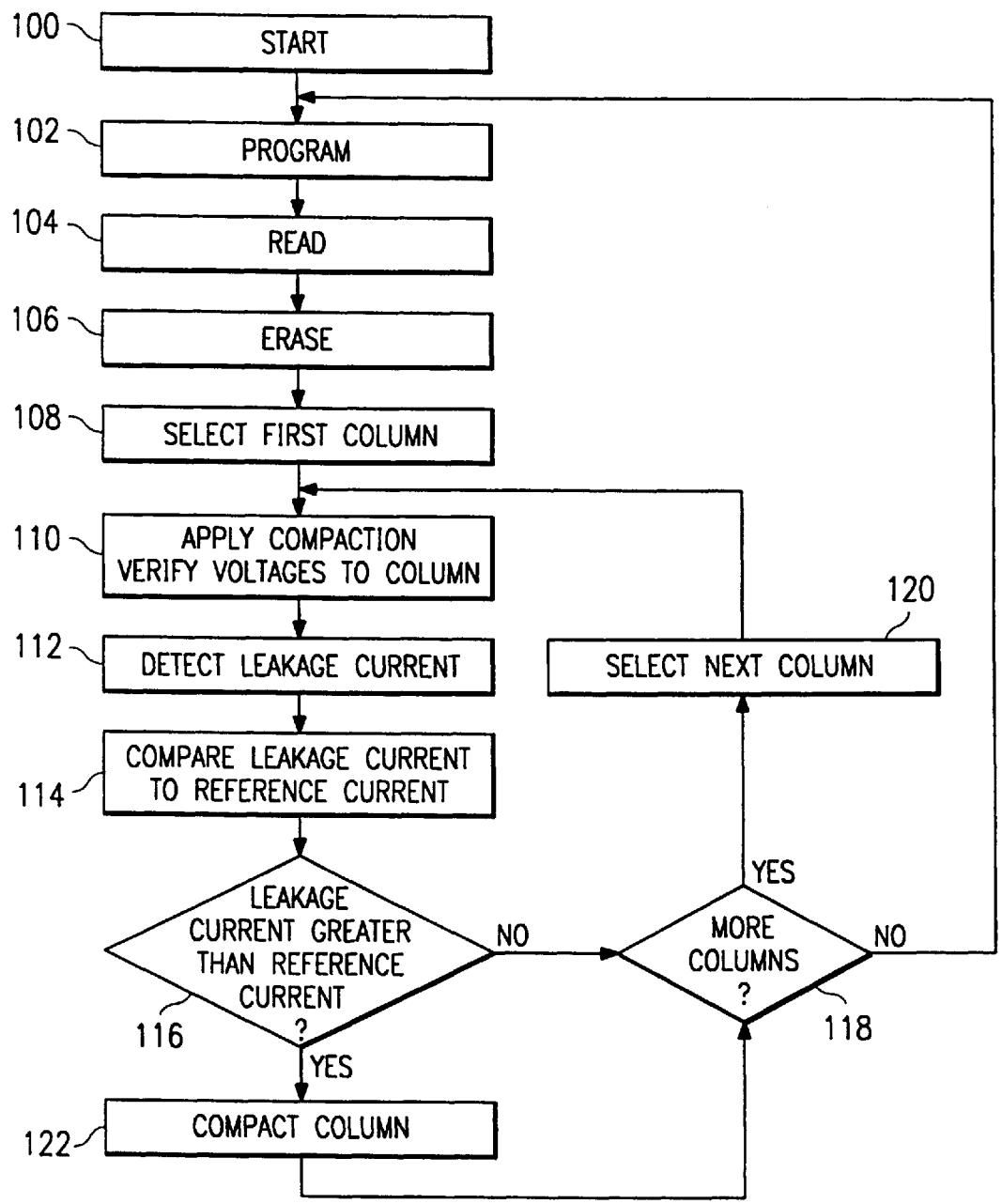
FIG. 3 is a flow chart of a method for testing and adjusting threshold voltages in flash EEPROMs in accordance with the present invention.

Referring to FIG. 3, a program-erase cycle for the memory cell array 5, including a compaction verify step in accordance with the present invention, is shown. The method begins at step 100. Typically, before the first usage of memory cell array 5, the array is completely erased by means of exposure to ultraviolet radiation. This eliminates all of the charge from the floating gates 13 of the cells 10 in the array 5.

The method proceeds to step 102, where selected cells 10 in the array 5 are programmed to a logic 1 state. In this step, the wordline decoder 16 functions, in response to wordline address signals on lines 20r and to signals from microprocessor 21, to place a preselected first programming voltage Vp1, in this example approximately +12 V, on the wordline 15 for a selected cell 10. Column decoder 19 also functions to place a second programming voltage Vp2 (approximately +3 to +10 V) on the bitline 18 for the selected cell 10. Source lines 17 are connected to reference potential $V_{ss}$, which may be ground. All of the deselected bitlines 18 are connected to reference potential $V_{ss}$ or are floated.

These programming voltages create a high drain-to-source current in the channel of the selected memory cell 10, resulting in the generation of channel-hot electrons and avalanche-breakdown electrons near the drain-channel junction. These electrons are injected across the channel oxide to the floating gate 13 of the selected cell 10. The programming time is selected to be sufficiently long to program the floating gate 13 with a negative program charge of approximately −2 V to −6 V with respect to the channel region.

The floating gate 13 of the selected cell 10 is charged with hot electrons injected during programming, and the electrons in turn render the source-drain path under the floating gate 13 of the selected cell 10 nonconductive during the read step to be described below, which is interpreted as a logic 1 state. Deselected cells 10 have source-drain paths under the floating gate 13 that remain conductive during the read step, which is interpreted as a logic 0 state.

It should be noted that, for memory cells 10 fabricated in accordance with this exemplary embodiment, the coupling coefficient between a control gate 14 and a floating gate 13 is approximately 0.6. Therefore, a programming voltage Vp1 of +12 V on a selected wordline 15 and control gate 14 places a voltage of approximately +7.2 V on the selected floating gate 13. The voltage difference between the floating gate 13 and the grounded source line 17 is insufficient to cause a Fowler-Nordheim tunneling current across the gate oxide between source 11 and floating gate 13 to charge the floating gate 13 of a selected or deselected cell 10.

After all of the selected cells 10 in array 5 have been programmed, thus storing a block of binary data in the array 5, the method proceeds to step 104, where data from the array 5 is read and utilized for its intended purpose. In this step, the wordline decoder 16 functions, in response to wordline address signals on lines 20r and to signals from microprocessor 21, to apply a preselected positive voltage $V_{cc}$ to the selected wordline 15. This voltage is selected to be higher than the threshold voltage of the transistor 10 in an erased state, and lower than the threshold voltage of the transistor 10 in a programmed state. In this example, $V_{cc}$ is approximately +4 or +5 V. Wordline decoder 16 also applies a low voltage, such as ground, to deselected wordlines 15.

The column decoder 19 applies a preselected positive voltage $V_{sen}$, in this example approximately +1 V, to at least the selected bitline 18 and applies a low voltage, such as ground, to the source line 17. The selected cell thus has a positive drain-source bias, and will either be conductive or non-conductive, depending on whether the wordline voltage is greater or less than the threshold voltage of the selected cell 10, which in turn depends on whether the cell is programmed (logic 1) or erased (logic 0).

The column decoder 19 functions, in response to signals on address lines 20d, to connect the selected bitline 18 of the selected cell 10 to a DATA IN/OUT terminal 22. The conductive or nonconductive state of the cell 10 connected to the selected bitline 18 and the selected wordline 15 is detected by a sense amplifier (not shown) connected to the DATA IN/OUT terminal 22.

Depending on the application for which the memory cell array 5 is being used, the above-described read step may be performed any number of times before proceeding to the next step in the process. Only after the data in the array S has been read and utilized, and it is determined that the data need no longer be stored in the array 5, will the method proceed from step 104 to step 106. At step 106, a flash-erase of the entire array 5 is performed, to set all of the cells 10 to a logic 0 state. This step may in some instances be preceded by a preconditioning step, in which all of the cells 10 are programmed to a logic 1 state before the erasing step is performed.

In the erasing step 106, the column decoder 19 functions to leave all bitlines 18 floating, or connected to a high impedance such as a field-effect transistor biased in "OFF" condition. The wordline decoder 16 functions to connect all the wordlines 15 to reference potential $V_{ss}$, which may be ground. The column decoder 19 also functions to apply a high positive voltage $V_{ee}$, in this example approximately +10 V to +15 V, to all the source lines 17. Alternatively, $V_{ss}$ may be negative, such as −9 V, while $V_{ee}$ may be lower than in the previously-described embodiment, such as +6 V. In either case, the potential difference between the floating gate and the source has the same polarity and approximately the same magnitude. $V_{ee}$ may even be as low as 0 V or ground, with $V_{ss}$ being set at a corresponding negative value so as to keep approximately the same potential difference between the two.

These erasing voltages create sufficient field strength across the gate oxide region to generate a Fowler-Nordheim tunnel current that transfers charge from the floating gate 13, erasing each memory cell 10 in the array 5. Since the potential on the wordline 15 is 0 V or negative, the cell 10 remains in the nonconducting state during erase. For that reason, and also by reason of the fact that the drain 12 is floated, no channel-hot carriers are generated.

An alternative flash-erase procedure is described in U.S. Pat. No. 5,428,878, issued to Kaya et al. on Jun. 27, 1995 and assigned to the present assignee. This flash-erase procedure involves the application of light erasing pulses in steps, checking after each step to determine whether the threshold voltages of all of the cells have been reduced below a predetermined level.

After a flash-erase has been performed at step 106 in accordance with one or more of the above-described methods, or using any other method, a compaction verify process in accordance with the present invention is performed, beginning at step 108. The general purpose of this process is to test the threshold voltages of the cells 10 in the array 5 to determine whether any of the threshold voltages are below a preselected positive voltage. If any of the threshold voltages are below the preselected value, then a compaction step to be described below may be performed to increase the threshold voltages of these cells 10.

The compaction verify process begins at step 108, where the first bitline 18 or column of cells 10 in the array 5 is selected for compaction verify. The method proceeds to step 110, where the column decoder 19 applies a preselected positive voltage $V_{sen}$, which is the read drain bias voltage applied to the bitline during the read step 104, and in this example is approximately +1 V, to the selected bitline 18, and applies a low voltage, such as ground, to the source line 17. Wordline decoder 16 places a positive voltage on all of the wordlines 15. In this example the positive voltage may range from 1 V to approximately 3.2 V, the latter value being the maximum threshold voltage of the erased threshold voltage distribution. This positive voltage is selected to minimize damage to the cell 10 during programming of adjacent cells.

The method then proceeds to step 112, where column decoder 19 functions, in response to signals on address lines 20d, to connect the selected bitline 18 to a current comparator 30. The selected bitline 18 conducts a current which is the combined leakage current for all of the cells 10 in the selected column. At step 114, the current comparator 30 compares the combined leakage current to a reference current $I_{ref}$, in this example approximately 8 μA. At decisional step 116, the current comparator 30 determines whether the combined leakage current for the column in greater than the reference current.

If the combined leakage current is greater than the reference current, indicating that one or more of the cells 10 in the column have threshold voltages below the desired level, then the method proceeds to step 122, where a compaction step to be described below is performed for the selected column.

If the combined leakage current is less than the reference current, indicating that no compaction is necessary for the selected column, then the method proceeds to decisional step 118. At this step, microprocessor 21 determines whether there are more columns to be checked. If so, then the method proceeds to step 120, where the next column in the array 5 is selected for compaction verification. The method then proceeds to step 110, where a compaction verify is performed for the selected column as previously described.

This process is repeated until all of the columns in array 5 have been checked and, if necessary, compacted. If, at decisional step 118, microprocessor 21 determines that no more columns remain to be checked in the array 5, then the method proceeds to step 102, where the array 5 may be re-programmed to store a new block of data.

When it is determined at decisional step 116 that the threshold voltages for the selected column in array 5 are to be compacted, the method proceeds to step 122. At this step, the wordline decoder 16 functions, in response to wordline address signals on lines 20r and to signals from microprocessor 21, to place a preselected first programming voltage Vp1, in this example approximately +1 V to +5 V, on all of the wordlines 15. Column decoder 19 also places a second programming voltage Vp2, in this example approximately +4 V to +7 V, on the selected bitline 18.

All of the source lines 17 are raised to a third programming voltage Vp3, in this example approximately +1 V to +2 V. This positive source voltage is applied to reduce damage to the array 5 during compaction.

These programming voltages create a relatively low current (drain 12 to source 11) condition in the channel of each of the cells 10 in the selected column, resulting in the generation channel-hot electrons and avalanche-breakdown electrons that are injected across the channel oxide to the floating gates 13 of the cells 10. The compaction time is selected to be sufficiently long to remove the undesired positive charge from all of the floating gates 13 in the column and to compact the threshold voltage distribution. In this example, the compaction time is on the order of one millisecond, during which the entire column is compacted. The small programming voltage Vp1 does not, of course, cause a sufficient Fowler-Nordheim tunneling current across the gate oxide between source 11 and floating gate 13 to charge the floating gates 13 of the cells 10. However, the floating gates 13 of cells 10 are charged slowly with hot electrons injected during compaction.

After the threshold voltages for the selected column have been compacted, the method proceeds to decisional step 118, where microprocessor 118 determines whether any more columns in the array 5 remain to be checked. When all of the columns have been checked and, if necessary, compacted, the method returns to step 102, where the array 5 may be re-programmed to store a new block of data.

When the compaction verify and compaction steps are performed as described after every flash-erase of the array 5, cells in the same column as a cell being programmed do not conduct significant leakage current. As a result, oxide charge builds up in the cells much more slowly than it would in the absence of the compaction verify and compaction steps. This delays the degradation in the transconductance of the cells, extending the number of program-erase cycles to which the cells may be subjected while remaining fully operational.

While the invention has been particularly shown and described by the foregoing detailed description, it will be understood by those skilled in the art that various other changes in form and detail may be made without departing from the spirit and scope of the invention.

What is claimed is:

1. A method for compacting a threshold voltage distribution of a plurality of cells in a floating-gate EEPROM, comprising the steps of:

selecting one of the plurality of cells;

determining whether the selected cell has a threshold voltage less than a predetermined voltage wherein the determining comprises applying to a control gate of the cell a control gate voltage that is greater than zero volts, and measuring a current conducted by the cell; and increasing the threshold voltage of the cell in response to the step of determining whether the selected cell has a threshold voltage less than a predetermined positive voltage step.

2. The method of claim 1 further comprising the step of flash-erasing the plurality of cells.

3. The method of claim 1 wherein the determining step further comprises the step of applying a positive drain voltage less than the control gate voltage to a drain of the cell.

4. The method of claim 1 wherein the determining step further comprises the step of comparing the current conducted by the cell to a reference current.

5. The method of claim 1 wherein the increasing step comprises the steps of:

applying a positive drain voltage to a drain of the cell;

applying a positive source voltage to a source of the selected cell; and applying a positive control gate voltage to a control gate of the cell.

6. A method for compacting a threshold voltage distribution of a floating-gate EEPROM, comprising the steps of:

selecting a cell column having a plurality of memory cells;

applying a control gate voltage that is greater than zero volts to a control gate terminal of each one of the memory cells of the selected cell column;

detecting a total current conducted by the plurality of memory cells of the selected cell column;

comparing the total current to a reference current; and increasing respective threshold voltages of the memory cells of the selected cell column in response to the comparing step.

7. The method of claim 6 wherein the selecting step comprises the step of selecting a cell column having a plurality of memory cells connected to a common bitline.

8. The method of claim 6 further comprising the step of flash-erasing the floating-gate EEPROM.

9. The method of claim 6 further comprising the step of applying a positive drain voltage to a drain terminal of the cell, wherein the positive control gate voltage is no less than the positive drain voltage.

* * * * *

UNITED STATES PATENT AND TRADEMARK OFFICE
CERTIFICATE OF CORRECTION

PATENT NO. : 5,909,397
DATED : June 1, 1999
INVENTOR(S) : Kemal T. San

It is certified that error appears in the above-identified patent and that said Letters Patent is hereby corrected as shown below:

Title page, insert the following item:
  --[60] Provisional Appl. No. 60/027,971, filed Oct. 8, 1996--.

Col. 1, line 4, insert the following:
  -- Cross Reference To Related Application, Reference is made to and priority claimed from U.S. Provisional Appl. Ser. No. 60/027,971, filed Oct. 8, 1996 --.

Signed and Sealed this

Eighth Day of August, 2000

Attest:

Q. TODD DICKINSON

*Attesting Officer*   *Director of Patents and Trademarks*